United States Patent

Sandstrom et al.

[11] Patent Number: 6,067,306
[45] Date of Patent: May 23, 2000

[54] LASER-ILLUMINATED STEPPER OR SCANNER WITH ENERGY SENSOR FEEDBACK

[75] Inventors: Richard L. Sandstrom, Encinitas; Palash P. Das, Vista; Igor V. Fomenkov; Herve A. Besaucele, both of San Diego; Robert G. Ozarski, Poway, all of Calif.

[73] Assignee: Cymer, Inc., San Diego, Calif.

[21] Appl. No.: 09/081,374

[22] Filed: May 19, 1998

Related U.S. Application Data

[63] Continuation-in-part of application No. 09/034,870, Mar. 4, 1998, Pat. No. 6,005,879, and a continuation-in-part of application No. 08/908,862, Aug. 8, 1997.

[51] Int. Cl.$^7$ ........................................ H01S 3/00
[52] U.S. Cl. .............................................. 372/38
[58] Field of Search ........................ 372/25, 38; 437/173

[56] References Cited

PUBLICATIONS

K. Suzuki, et al., "Dosage Control for Scanning Exposure with Pulsed Energy Fluctuation and Exposed Position Jitter", Jpn. J. Appl. Phys. vol. 34 (1995), pp. 6565–6572, no month.

G. deZwart, et al., "Performance Of A Step And Scan System For DUV Lithography", SPIE Symposium on Optical Microlithography, Mar. 1997, pp. 1–19.

*Primary Examiner*—Rodney Bovernick
*Assistant Examiner*—Robert E. Wise
*Attorney, Agent, or Firm*—John R. Ross, Esq.

[57] ABSTRACT

A laser-illuminated wafer-exposing system such as a stepper or scanner having a first light intensity detector located within the exposing system near a mask and second light intensity detector located near the output of the laser. A feedback control system controls the output of the laser based on signals detected by at least one of the detectors. The feedback control system includes a processor programmed with an algorithm which is used to control the laser discharge voltage in order to provide light pulses having desired intensity at the mask with the laser operating in a burst mode. The algorithm utilizes at least the following parameters; a previously measured pulse energy, a calculated energy error, a calculated dose error, a value for the rate of change of pulse energy with voltage, and at least one reference voltage. In a preferred embodiment the algorithm uses the pulse energy measured with the light intensity detector located near the mark to provide the feedback control and uses the light intensity detector at the output of the laser to assure that the output of the laser is maintained within a predetermined range.

19 Claims, 8 Drawing Sheets

LASER-ILLUMINATED STEPPER OR SCANNER WITH ENERGY SENSOR FEEDBACK

This invention is a continuation-in-part of Ser. No. 09/034,870, Pulse Energy Control for Excimer Lasers, filed Mar. 4, 1998, now U.S. Pat. No. 6,005,879, and Ser. No. 08/908,862, Stepper or Scanner Having Two Energy Monitors for a Laser, filed Aug. 8, 1997.

This invention relates to laser energy control equipment and methods and, in particular, to such equipment and techniques used for steppers and scanners for integrated circuit fabrication.

BACKGROUND

Laser-Illuminated Steppers and Scanners Lasers are frequently used as light sources in stepper and scanner systems for integrated circuits fabrication to selectively expose layers of photoresist on the silicon wafers. A mask (or reticule) is interposed between light and the wafer to allow the selective exposure. State of the art exposure systems include a relatively complex optical system to direct the laser radiation onto the wafer surface.

The amount of light required to adequately expose the photoresist during a step or scan is a product of the light intensity and the length of time that the light impinges upon the wafer. Typically, the laser light is generated in pulses at rates such as 1000 pulses per second, and the number of pulses needed to adequately expose the photoresist is determined based upon the intensity of the laser light. Prior art lithography lasers typically include a pulse energy monitor at or near the output of the laser. This monitor can be used in a feedback arrangement to control the energy of individual pulses and the integrated dose energy (total energy in a predetermined number of pulses). Pulse energy monitors may also be located within the stepper or scanner and efforts have been made to control the laser source using these monitors for feedback signals. However, these prior art feedback control systems have not proven very satisfactory and can create serious oscillations in the laser.

Energy Sigma

Pulse energy variation, which is defined by the phrase, "energy sigma", is important to integrated circuit lithographers. Energy sigma is the standard deviation from the mean energy of pulse energy in a series of pulses. Specifications on energy sigma are typically in the range of about 3 percent, but desired values may be much smaller. Prior art excimer lasers comprise feedback voltage control, which automatically adjusts the discharge voltage of each pulse based on the monitored energy of the preceding pulse or pulses. Lithography lasers may be operated in a continuous mode at pulse rates such as 1,000 Hz in which case laser and optical effects quickly reach equilibrium and it is relatively easy to keep energy sigma small utilizing the pulse energy-voltage feedback control.

Burst Mode Operation

Continuous laser operation for integrated circuit lithography is not typical. A more typical mode of operation is called the burst mode in which the laser is operated at a pulse rate such as 1,000 Hz for about 110 to 250 pulses (the series of pulses being called a "burst") followed by a dead time of a fraction of a second such as about 0.2 second, to a few seconds or longer. During these dead times the wafer being illuminated is either stepped (i.e., moved a few millimeters) or a treated wafer is replaced with a to-be-treated wafer or a new cassette of wafers is moved into place. In addition to controlling energy sigma, it is in many situations even more important to control the total dose during each burst as close as possible to a target value.

If the laser is operated in a burst mode at constant voltage, the result is a wide swing in pulse energy of the beam as it exits the laser during the first 40 milliseconds of the burst. Also, transient conditions in the optical elements of the stepper or scanner can cause variation in the energy reaching the mask. These combined effects can cause substantial variation in pulse energy reaching the mask. Prior art energy feedback control circuits only partially reduce the energy variations. It is known that the swings are relatively repetitive from burst to burst. Therefore, attempts have been made to program the voltage control with time dependent algorithms in order to reduce the pulse energy variation during these first 40 pulses.

What is needed is an energy sensor feedback system capable of better correcting for beam perturbations in the stepper or scanner optics as well as in the laser system.

SUMMARY OF THE INVENTION

The present invention provides a laser-illuminated wafer-exposing system such as a stepper or scanner having a first light intensity detector located within the exposing system near a mask and second light intensity detector located near the output of the laser. A feedback control system controls the output of the laser based on signals detected by at least one of the detectors. The feedback control system includes a processor programmed with an algorithm which is used to control the laser discharge voltage in order to provide light pulses having desired intensity at the mask with the laser operating in a burst mode. The algorithm utilizes at least the following parameters; a previously measured pulse energy, a calculated energy error, a calculated dose error, a value for the rate of change of pulse energy with voltage, and at least one reference voltage. In a preferred embodiment the algorithm uses the pulse energy measured with the light intensity detector located near the mask to provide the feedback control and uses the light intensity detector at the output of the laser to assure that the output of the laser is maintained within a predetermined range.

DETAILED DESCRIPTION OF THE PREFERRED EMBODIMENT

First Preferred Embodiment

Stepper System

Figure 1:
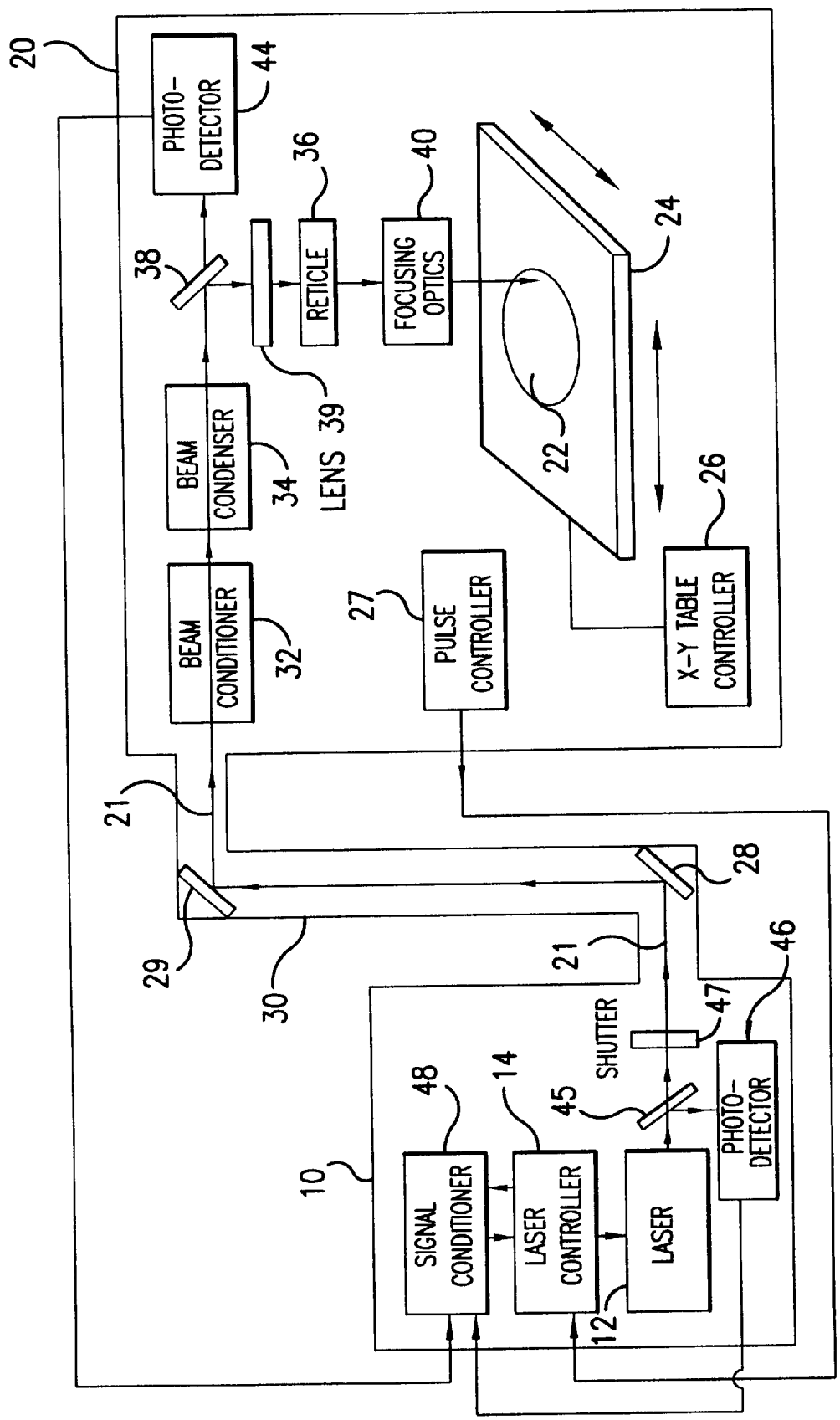
FIG. 1 illustrates a laser system and a stepper/scanner exposure system modified to include a light intensity monitor proximate to the wafer and a light intensity monitor in the laser system.

FIG. 1 illustrates a stepper system for the lithographic printing of integrated circuits on silicon wafers incorporating the present invention. In FIG. 1, an excimer laser system 10 contains an excimer laser excitation chamber, identified as laser 12, and various feedback control circuits and mechanisms to adjust the wavelength, spectral width, intensity, and burst duration of laser light emitted from the laser system 10. These control circuits and mechanisms are shown as laser controller 14. Methods and structures for tuning a laser, controlling its intensity, and controlling the pulses of laser light are well known, and any suitable method may be used for controlling the laser output of laser system 10.

A stepper 20 receives a laser beam 21 from laser system 10 and ultimately focuses a mask pattern onto a small section (about 2 cm$^2$) of semiconductor wafer 22 for exposing a layer of photoresist on wafer 22. After a predetermined number of pulses of laser light, wafer 22 is stepped in an X and/or Y direction by an X-Y table 24. A controller 26 controls the position of the X-Y table 24 in response to a software routine after each exposure of wafer 22. A pulse controller 27 provides signals to laser system 10 to generate a predetermined number of pulses (such as about 110) during each step of wafer 22. A keyboard and computer (not shown) forming part of stepper 20 may be used to program controllers 26 and 27 for automatic processing of wafer 22.

Laser Beam

The excimer laser system 10 is typically manufactured as an independent unit, and it is not known beforehand precisely how the light output of the laser system 10 will be affected by the stepper optics. The laser beam 21 output by the laser system 10 is directed by mirrors 28 and 29 within a nitrogen-filled conduit 30 to a light input port of stepper 20. Nitrogen is used to prevent moisture from entering conduit 30 and attenuating the laser light propagating through conduit 30.

Beam conditioner optics 32 and beam condenser optics 34 alter the beam 21, as required, prior to its application to a reticle 36 containing one or more mask patterns. The beam conditioning optics 32 may include a series of lenses (forming a homogenizer) to average the spatial intensity of the laser beam 21 over the area of the beam. Such a homogenizer may use a two dimensional array of small lenses followed by a second lens to average the light outputs of the small lenses. The conditioner optics 32 and condenser optics 34 may also expand the beam, as necessary, to form a square beam. Such optics 32 and 34 may be conventional.

A partially reflecting mirror 38, and possibly other optics if needed, redirects the beam through lens 39 onto reticle 36. The mask pattern on reticle 36 is typically chrome or other opaque material formed in a pattern to be replicated in the photoresist on the surface of wafer 22. Focusing optics 40 focuses the light passing through reticle 36 onto a 2-cm$^2$ area of wafer 22.

A small percentage of the light impinging upon the partially reflecting mirror 38 is received by a photodetector 44, which is a conventional photodiode detector having a sample and hold circuit. One suitable type of photodetector consists of a photodiode whose current output is proportional to the impinging light intensity after subtracting a DC offset. Such photodetectors are well known. The conventional sample and hold circuit, samples the integrated signal corresponding to the energy of a pulse about 50 ns in duration and holds the signal until it can be read by a computer processor. A similar mirror 45 and photodetector 46 is used to measure the beam 21 intensity at the laser 12 output. A conventional shutter 47 controllably blocks beam 21 from entering stepper 20 and is located downstream from mirror 45. The X-Y table controller 26 is programmed to step wafer 22 to a next position after a predetermined number of pulses of laser energy, typically having a predetermined wavelength and pulse width. The number of pulses is calculated based upon the required total energy of light impinging on the wafer during a step. This requires an accurate determination of the light energy.

An excimer laser, including its power supply, control circuits, and cooling system, is a relatively large device external to the stepper. Since the attenuation provided by the various optics in stepper 20 may change during use, the energy in the pulses generated by the laser system 10 for a particular step may undesirably be greater or less than that which is optimally needed to expose the photoresist on wafer 22. By locating the photodetector 44 after the stepper optics that could cause attenuation of concern and prior to reticle 36, and using it for feedback energy control, any attenuation or distortion by the stepper optics is automatically taken into account when adjusting the light intensity of the laser output. However, using photodetector 44 alone cannot identify whether the cause of any energy transients is due to the optics or due to the laser system 10 itself.

Controlling Laser Output

Computer processor 48 receives the signals from photodetectors 44 and 46, as well as other information regarding the timing of laser pulses and bursts, and processes the outputs of photodetectors 44 and 46 using a special algorithm in order to determine the adjustments to the laser to achieve desired individual pulse energy and integrated dose energy. The output of processor 48 is further processed by circuitry in the laser controller 14 to control the operating voltage of laser 12 in order to control laser output.

Figure 2:
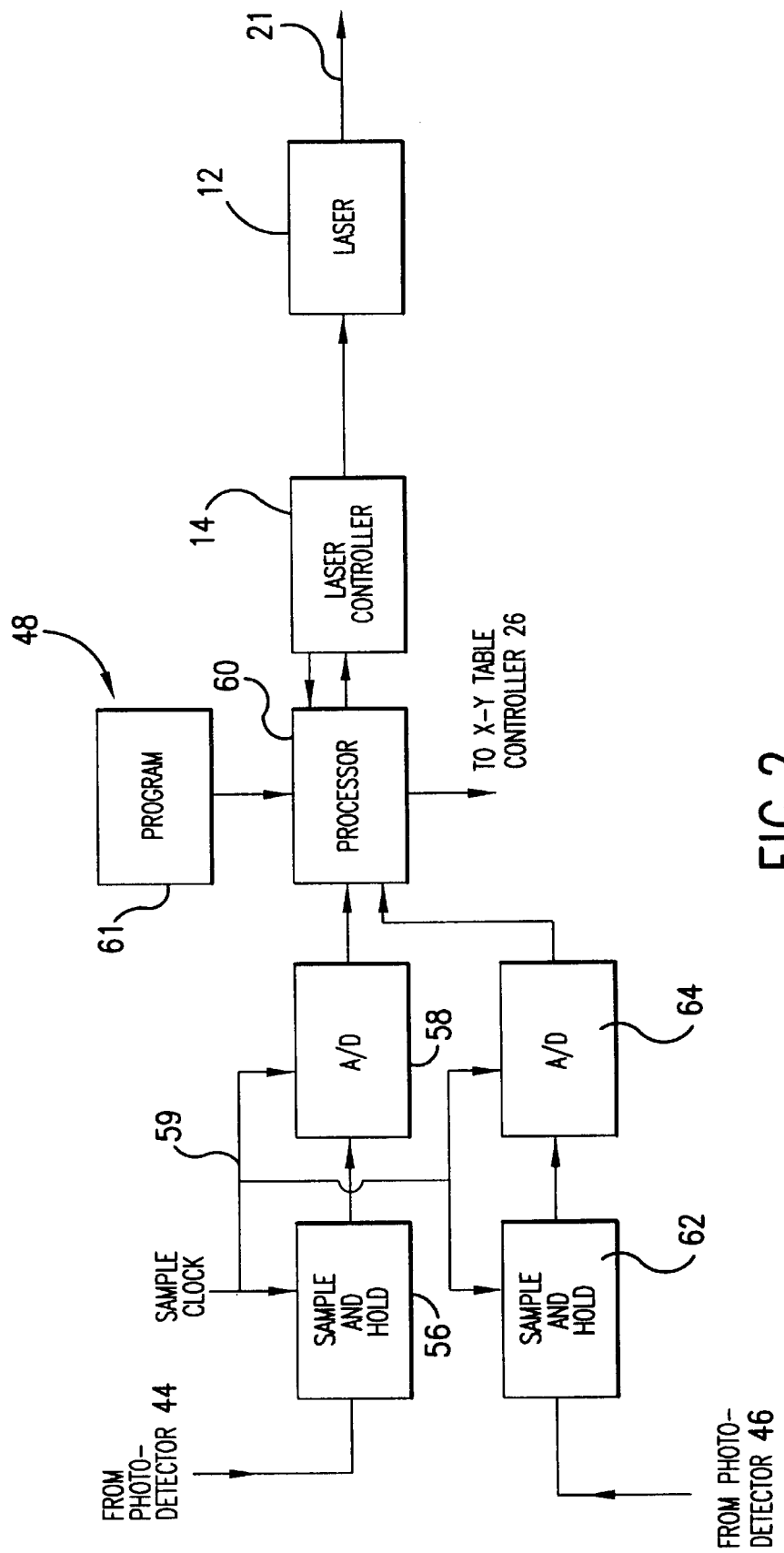
FIG. 2 generally illustrates the feedback system used for adjusting the laser output.
Figure 3:
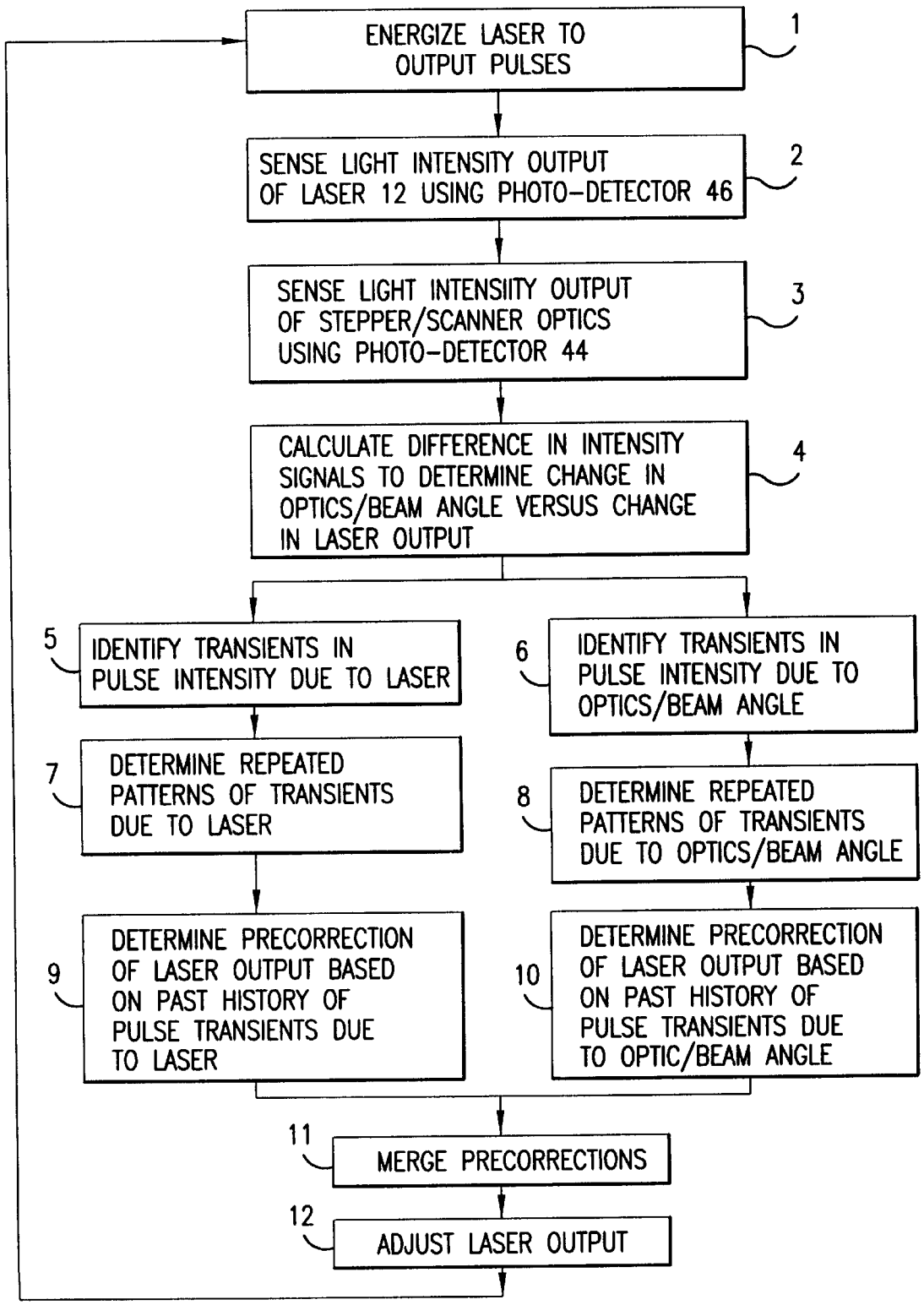
FIG. 3 is a first flowchart showing the use of the signals from the two detectors in controlling the laser output.

FIG. 2 generally illustrates the feedback circuitry within the laser system 10 for controlling the intensity of laser light during each pulse and for adjusting other characteristics of the laser if desired.

The signal from photodetector 44 in stepper 20 is typically an analog signal. This signal is first integrated over a time interval larger than the pulse duration and sampled using a sample and hold circuit 56 so as to effectively obtain a measurement of the light energy of each pulse. The resulting signal is then converted into a digital signal using an analog-to-digital converter 58. A sample clock 59 is provided to sample and hold circuit 56 and measure all the energy in analog-to-digital converter 58 so that the readings are taken at the appropriate time to measure all the energy in the approximately 30–50 ns pulse.

The digital output of converter 58 is then applied to processor 60, which can be a personal computer, programmed by software 61 to correlate the digital signals representing light intensity to control signals used to control the laser 12 itself. Processor 60 can also be a hard-wired ASIC. Analog signals from photodetector 46 in the laser system 10 are processed by an identical sample and hold circuit 62 and analog-to-digital converter 64 and applied to processor 60.

A laser controller 14 receives the control signals from processor 60 and adjusts the characteristics of laser 12 using known methods. One known method used to adjust the light intensity output of a laser is to adjust the charging voltage of laser 12 which in turn is compressed and amplified to generate a much higher discharge voltage which is approximately proportional to the charging voltage.

Pulse and Dose Energy Control

In this embodiment, laser 12 operates with a repetition rate of 1000 pulses per second. The energy per pulse is typically about 10 mJ. Typical illumination steps are as follows:

| Time | |
|---|---|
| Move wafer | 0.1 second |
| Illuminate | 0.11 second (110 pulses) |
| Move wafer | 0.1 second |
| Illuminate | 0.11 second (110 pulses) |
| Move wafer | 0.1 second |
| Illuminate | 0.11 second (110 pulses) |
| Illuminate | 0.11 second (110 pulses) |
| Illuminate | 0.11 second (110 pulses) |
| Illuminate | 0.11 second (110 pulses) |
| Move wafer | 0.1 second |
| Illuminate | 0.11 second (110 pulses) |
| Change wafers | 10 seconds |
| Move wafer | 0.1 second |
| Illuminate | 0.11 second (110 pulses) |
| Illuminate | 0.11 second (110 pulses) |
| Illuminate | 0.11 second (110 pulses) |
| Illuminate | 0.11 second (110 pulses) |

Thus, normal operation is bursts of 110 pulses in about 110 milliseconds followed by dead times of about 0.1 per second and occasionally about 10 seconds. At various times, longer dead time periods will be provided so that other operations can be performed. This basic process continues 24 hours a day, 7 days per week, for several months with the laser typically producing a few million pulses and a few thousand bursts per day. In the above burst mode, it is usually important that each section of the wafer received the same illumination energy on each burst. Also, chipmakers want the pulse to pulse variation (energy sigma) to be minimized.

This preferred embodiment of the present invention uses equipment and software which monitors the energy of each pulse (pulse N−1) then controls the energy of the next pulse (pulse N) based on the results of:

1) A comparison of the measured energy of pulse N−1 with a target pulse energy and
2) Comparisons of the accumulated dose of the burst through pulse N−1 to a target pulse dose through pulse N−1.

Operating in such a burst mode creates significant transients both within the laser itself and in the optical train of the stepper device. Applicants have discovered that major transients occur in the laser within the first 30–40 milliseconds after the beginning of the burst. In the stepper optical train, the major transients occur during the first 10 to 15 milliseconds of a burst.

Efforts have been made to eliminate these transients by proper choice of laser and optical components; however, despite these efforts, significant transients remain and they must be dealt with. Applicants have minimized the effects of these transients with the present invention, which provides active pulse-to-pulse pulse-energy monitoring and pulse-to-pulse control of the laser output. These pulse energy values, along with historical pulse energy values and charging voltages, along with values of the rate of charge of energy with voltage, dE/dV are then used to adjust the charging voltage prior to each pulse in order to improve energy sigma and control dose energy to within desired ranges.

Importance of Accurate dE/dV

Prior art methods of controlling the output pulse energy generally measure the deviation from a desired target energy, and then calculate a correction to the charging voltage for the next pulse which is intended to produce a closer approximation to the desired energy. The amount of the correction in prior art has been either a constant increment (or decrement) of the voltage, or an increment which is proportional to the energy error. This proportionality constant has in prior art been fixed: for example, the charge voltage might be reduced by 50 volts for every +1 mJ error in the energy. In these control schemes, the proportionality constant is a fixed parameter of the control software, and is determined experimentally ahead of time by the laser designer. The ideal value of this proportionality constant is derived from the local derivative (slope) of the energy versus voltage curve, dE/dV. Given an energy error, the voltage correction should be DV=DE/(dE/dV), where 1/(dE/dV) is the constant of proportionality previously discussed.

Figure 5:
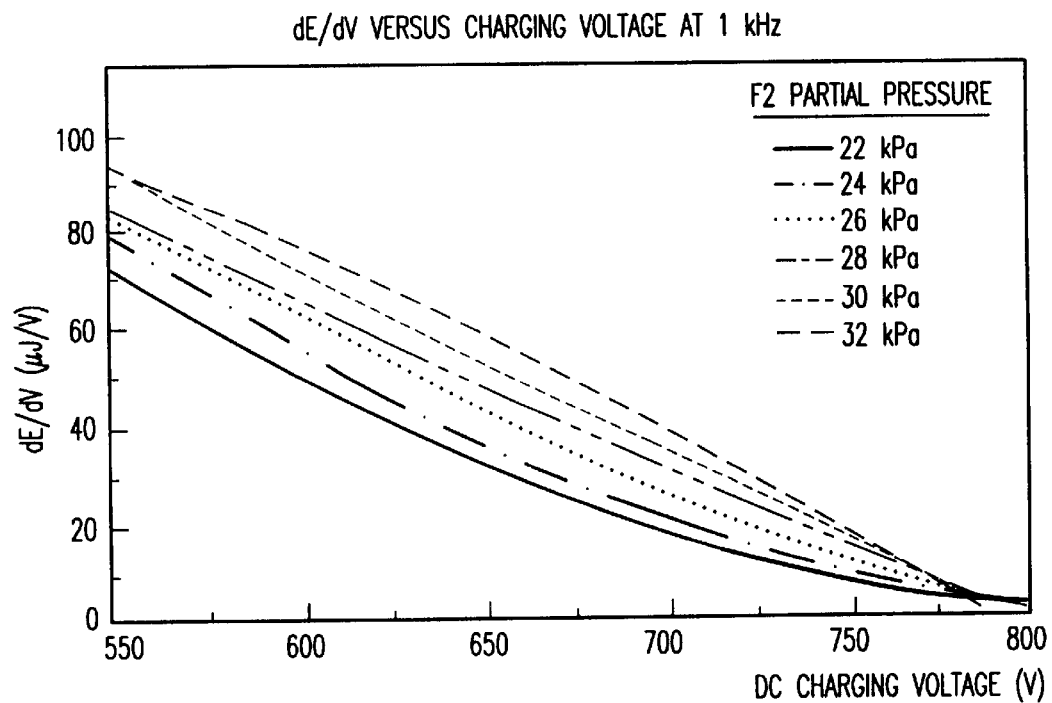
FIG. 5 is a graph of dE/dV as a function of charging voltages.
Figure 6:
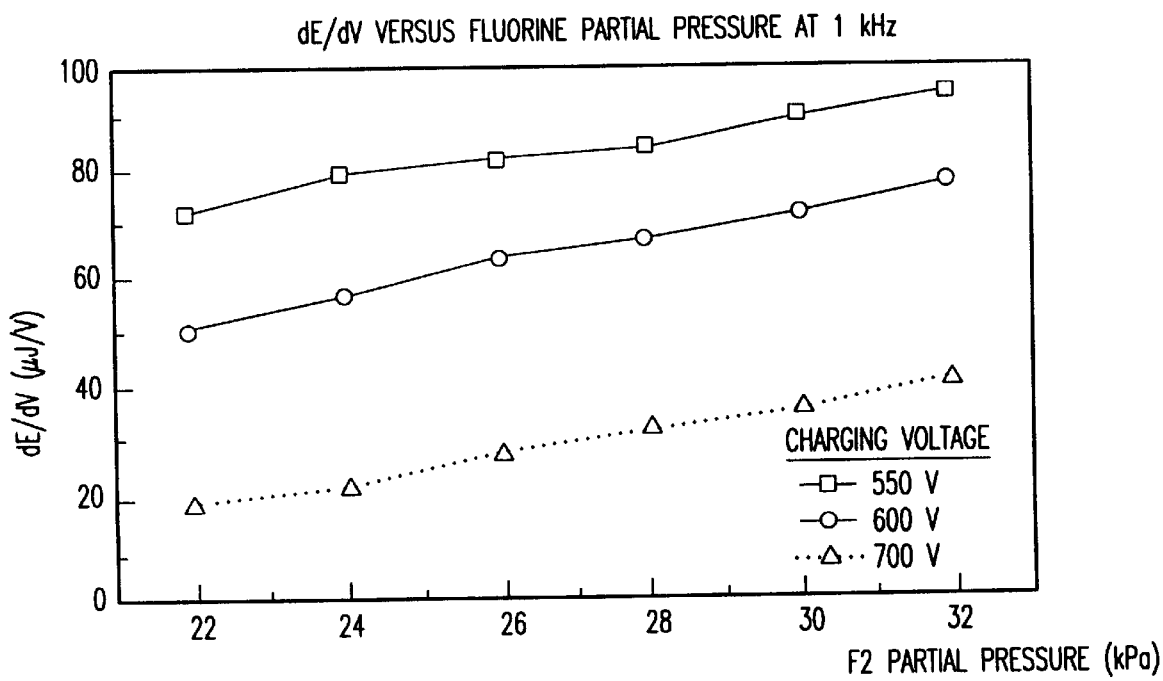
FIG. 6 is a graph of dE/dV as a function of fluorine concentration.

It is important that the value for dE/dV is accurately set, since this affects how quickly and accurately the control algorithm converges to the target energy. A value of 1/(dE/dV) which is too small will lead to slow and inaccurate convergence. Conversely, a value of 1/(dE/dV) which is too large can lead to violent instability in the control algorithm. Unfortunately, dE/dV is not a constant, but can vary over time due to various factors such as operating voltage, fluorine concentration, gas temperature, aging of components, etc. FIG. 5 shows a representative graph of dE/dV as a function of charging voltage for various fluorine concentrations (the energy is not a constant). FIG. 6 shows dE/dV as a function of fluorine concentration at three different voltage levels. As a result, the control schemes described in prior art have been forced to set the proportionality constant to a much smaller than optimal value, to insure that the algorithm does not go unstable under some conditions.

It is the intent of the control scheme described in this patent to provide a way to directly measure the parameter dE/dV in a semi-continuous manner, in a way which does not require interruption of the operation of the laser, thereby providing at all times the optimum control of the laser energy.

Reentry Slug and Optical Path Energy Swings

In the typical KrF excimer laser used in lithography, the time required for gas in the laser chamber to make one round trip from the electrode around the chamber and back to the electrodes be about 30 milliseconds. Applicants have determined that with the laser operating at 1,000 Hz, there is on the average a substantial decrease in energy output at constant charging voltage for the pulses occurring about 30 milliseconds after the start of the burst (such as pulses, N=28, 29, 30, 31 and 32). Applicants believe this decrease in pulse energy (with constant charging voltage) is related to the return to the electrodes of the gas that was between the electrodes during the first few pulses of the burst. Evidence of this is experimental results that show that the timing of the dip in output can be delayed by slowing down the gas circulation rate. Applicants refer to this gas returning from the first pulse as a "reentry slug." Also, the energy of the first pulse of a burst is typically substantially different than the subsequent pulses of the burst. After about 40 ms following the first pulse, the pulse energy at constant voltage is relatively constant. In dealing with these early perturbations, Applicants have separated the burst into two time-wise regions, the first region (consisting of a number of the earlier pulses, for example, 40 pulses) called the "K" region and a second region (consisting of the pulses which follow the K region) which Applicants, in this specification, refer to as the "L" region.

The first few pulses of each burst experience a substantial variation in degree of degradation as they pass along the optical path of the stepper optics. These effects are believed to be due to vibrations and/or thermal transients in the optical elements. After about 10 pulses into the burst, these variations tend to substantially die out.

Equipment

Figure 4:
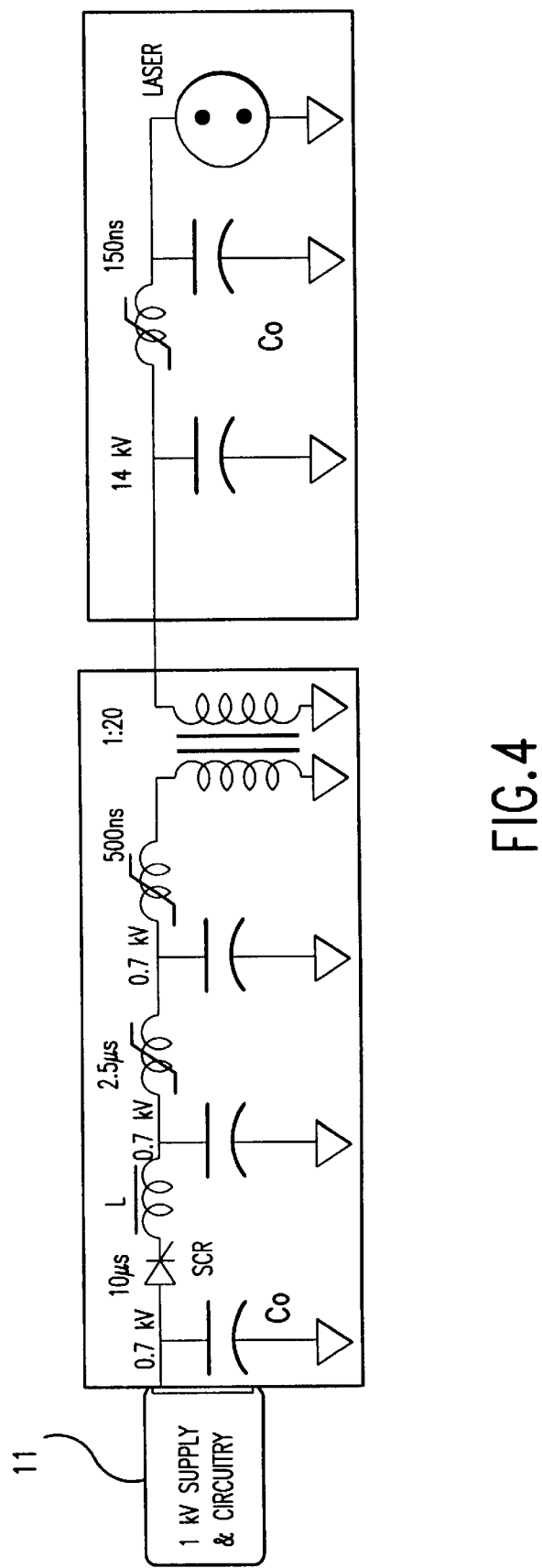
FIG. 4 is simplified electric circuit diagram of a preferred pulse power system for an excimer laser.

This embodiment of the present invention utilizes conventional excimer laser equipment for pulse energy control. Pulse energy of each pulse of each burst is measured by photodiodes 44 and 46. Photodiode 46 measures the output of laser 12, just beyond its output coupler therefore the signal from this detector is sensitive to perturbations within the laser such as those caused by the slug-effect, but does not see perturbations in the optical train. Photodiode 44 sees perturbations within the laser and the optical trains and therefore provides a better representation of the energy on the reticle. The response time of these photodiodes is less than 1 millisecond. The accumulated signal resulting from each approximately 20 ns pulse is stored and this signal is read by computer controller 22 approximately 1.0 microsecond after the beginning of the pulse. The accumulated energy of all the previous individual pulses in a burst is referred to as the burst dose value. Computer controller utilizes the signal representing the pulse energy of pulse N along with target pulse energy and the burst dose value in order to specify the high voltage for the pulse N+1. This calculation requires about 200 microseconds. When the value of high voltage for N+1 is determined, computer controller sends a signal to high voltage power supply 11 establishing the charging voltage for pulse N+1 that takes a few microseconds. Computer controller 22 commands high voltage power supply 11 to charge up capacitor Co to the specified voltage. (At high repetition rates it may be desirable to start the charging before the calculation is complete.) The charging requires about 400 microseconds so that Co is fully charged and ready to go when it receives a trigger signal for pulse N+1 from trigger circuit 13 at 1.0 millisecond after the trigger signal from pulse N. On the trigger signal, capacitor Co discharges its approximately 650 volts into the magnetic compression circuit shown in FIG. 4 over a period of about 5 microseconds and the pulse is compressed and amplified by the magnetic compression circuit to produce a discharge voltage on capacitor Co of about 16,000 volts which discharges across electrodes 6 in about 100 ns producing a laser pulse of about 10 mJ and about 75 ns (95% integral) in duration.

Preferred Algorithm

A special preferred process for adjusting the charging voltage to achieve substantially desired pulse energies when operating in a burst mode is described below.

The process utilizes two voltage adjustment algorithms. The first algorithm called the PI algorithm applies to pulses after pulse number 40 (the "L region") of the burst. The second algorithm applies to the first 40 pulses and is called the KPI algorithm. The initials "PI" refers to "proportional integral" and the "K" in "KPI" refers to the "K region" of the burst.

KPI algorithm p The K region comprises pulses 1 through k, where k=40 for this preferred embodiment. The algorithm for setting the charging voltage for pulse N is:

$$V_N = (V_B)_N - (V_C)_{N-1} \quad N=1, 2, \ldots k$$

where:

$V_N$=charging voltage for N'th pulse $(V_B)_N$=an array of k stored voltages which represent the current best estimate of the voltage required to produce the target energy $E_T$ for the N'th pulse in the K region. This array is updated after each burst according to the equation below.

$(V_C)_{N-1}$=a voltage correction based the energy error of the previous pulse and on the energy errors which occurred for the previous pulses in the burst, up to pulse N-1

$$= \sum_{i=1}^{N-1} \frac{(A \cdot \epsilon_1 + B \cdot D_i)}{(dE/dV)}$$

By definition, $(V_c)_0 = 0$

A,B=fractions typically between 0 and 1, which in this preferred embodiment both A and B are 0.5

$\epsilon_i$=the energy error of the i'th pulse
$=E_i-E_T$, where $E_i$ is the energy for the i'th pulse, and $E_T$ is the target energy $D_i$=the cumulative dose error of the burst, including all pulses from 1 through i $$= \sum_{k=1}^{i} \epsilon_k$$

dE/dV=a rate of change of pulse energy with charging voltage. (In this embodiment, one or more values of dE/dV is determined experimentally during each burst and a running average of these values is used for the calculation)

The stored values $(V_B)_N$ are updated during or after each burst according to the following relation:

$$(V_B)_N^{M+1} = (V_B)_N^M - C \cdot \left( \frac{\epsilon_N}{dE/dV} - (V_C)_N \right),$$

where the index M refers to the burst number

C=a fraction typically between 0 and 1, which in this preferred embodiment is 0.3.

PI Algorithm

The L region comprises pulses k+1 to the end of the burst (for a preferred embodiment, pulse numbers 41 and higher). The algorithm for setting the charging voltage for pulse N is:

$$V_N = V_{N-1} - \frac{(A \cdot \epsilon_{N-1} + B \cdot D_{N-1})}{(dE/dV)}$$

$$N = k+1, k+2, \ldots$$

where:

$V_N$=charging voltage for N'th pulse $V_{N-1}$=charging voltage for N-1'st (previous) pulse The variables A, B, $\epsilon_1$, $D_1$, and dE/dV are defined as before.

Determination of dE/dV

A new value for dE/dV is determined periodically, in order to track the relatively slow changes in the characteristics of the laser. In the preferred embodiment, dE/dV is measured by varying or "dithering" the voltage in a controlled way during two successive pulses in the L region. For these two pulses, the normal PI energy control algorithm is temporarily suspended and replaced by the following:

For pulse j:

$$V_j = V_{j-1} - \frac{(A \cdot \epsilon_{j-1} + B \cdot D_{j-1})}{(dE/dV)} + V_{Dither}$$

where $V_{Dither}$=a fixed voltage increment, typically a few volts
For pulse j+1:

$$V_{j+1} = V_j - 2 \cdot V_{Dither}$$

After pulse j+1, dE/dV is calculated:

$$dE/dV = \frac{(E_{j+1} - E_j)}{2 \cdot V_{Dither}}$$

The calculation of dE/dV can be very noisy, since the expected energy changes due to the dithering voltage can be of the same magnitude as the normal energy variation of the laser. In the preferred embodiment, a running average of the last 50-dE/dV calculations is actually used in the PI and KPI algorithms.

The preferred method for $V_{Dither}$ choosing is to specify a desired energy dither $E_{Dither}$, typically a few percent of the energy target $E_T$, and then use the current (averaged) value for dE/dV to calculate $V_{Dither}$:

$$V_{Dither} = \frac{E_{Dither}}{(dE/dV)}$$

Pulse j+2 (immediately following the two dithered pulses) is not dithered, but has the special value:

$$V_{j-2} = V_{j-1} + V_{Dither} - \frac{(A \cdot (\epsilon_{j+1} + E_{Dither}) + B \cdot D_{j+1})}{(dE/dV)}$$

(pulse $j+2$)

This special value for $V_{j+2}$ is corrected for both the applied voltage dither and the expected energy dither from pulse j+1.

Pulse Energy Detection

As shown in FIG. 1, photodetector 46 samples the laser beam at the output of laser 12 and photodetector 44 samples the laser beam just upstream of the reticle. Either or both of the photodetectors can be used to provide the pulse energy signal for the control algorithm described above to control pulse energy and burst energy. In a preferred embodiment, Applicants use photodetector 44 near the reticle. The advantage of using this detector is that the entire system is controlled based on the energy the reticle is receiving. A disadvantage is that problems in the optical train could result in the control algorithm asking for too much energy from the laser. To minimize this potential problem, the above algorithm may be modified by placing an additional voltage control to limit the pulse energy as measured by photodetector 46 to a range of ±2 mJ around a target output, $E_T$, of, for example, 10 mJ. Exceeding the upper limit would indicate a problem in the optical train. A lower limit reading would indicate a problem with one of the detectors. The laser or stepper controls could be programmed to provide a warning signal if one of these limits is reached, or the voltage control algorithm could be modified to limit the charging voltage based on photodetector 46 if pulse energy measured by the detector approaches the upper limit.

Second Preferred Embodiment

Figure 9:
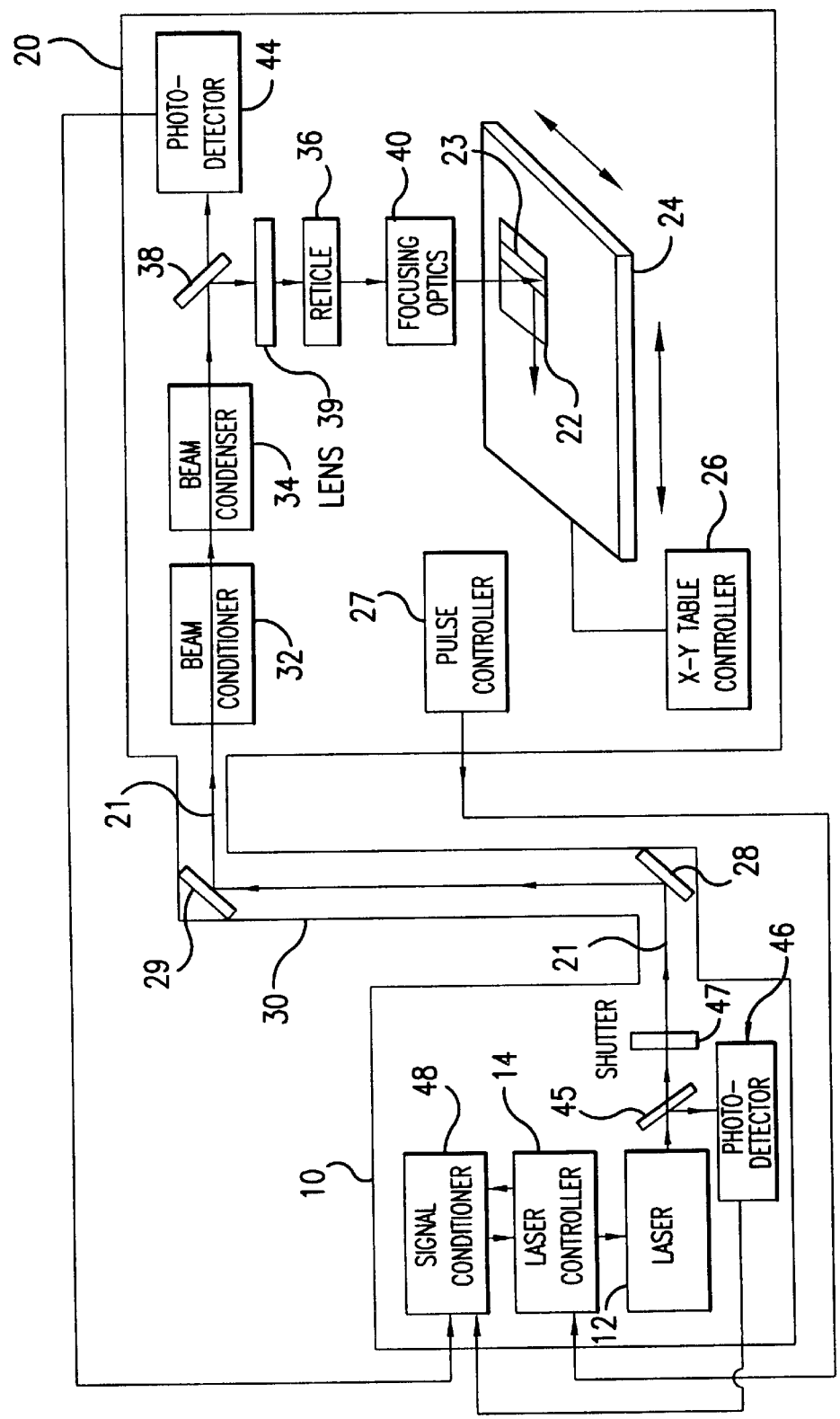
FIG. 9 shows a scanner system.

Scanner System FIG. 9 is a sketch of a scanner system for lithographic printing of integrated circuits. The sketch is representative of the type of systems called a scanner system and also step and scan systems. In both scanner systems and step and scan systems, the lens field at the wafer level is formed into a long rectangular shape such as about 26×8 mm as shown at 23. During illumination, both the reticle and the wafer are scanned simultaneously in opposite positions to expose image fields such as about 26−×33 mm as shown at 22. In the scanner system the wafer scans continuously from one side of the wafer to the other while the reticle scans in steps in the opposite direction during the laser bursts to illuminate the image fields of reticle returns. In the step and scan systems, both the wafer and the reticle are stepped between illuminations, then scanned in opposite directions during the illumination periods.

A typical illumination period at 1000 Hz and 10 mJ pulses is about 250 milliseconds. The wafer scan speed is in the range of about 200 mm/second or about .2 mm/millisecond. Since the lens field is about 8 mm wide, the illumination time on each point on the wafer is about 40 milliseconds so that each spot on the target area of the wafer sees about 40 pulses. These pulses are focused to about ⅓ the cross-sectional area of the stepper lens field so that the total dose energy of each spot on the wafer is about the same for both the stepper and the scanner.

Stepper Energy Control

Figure 7:
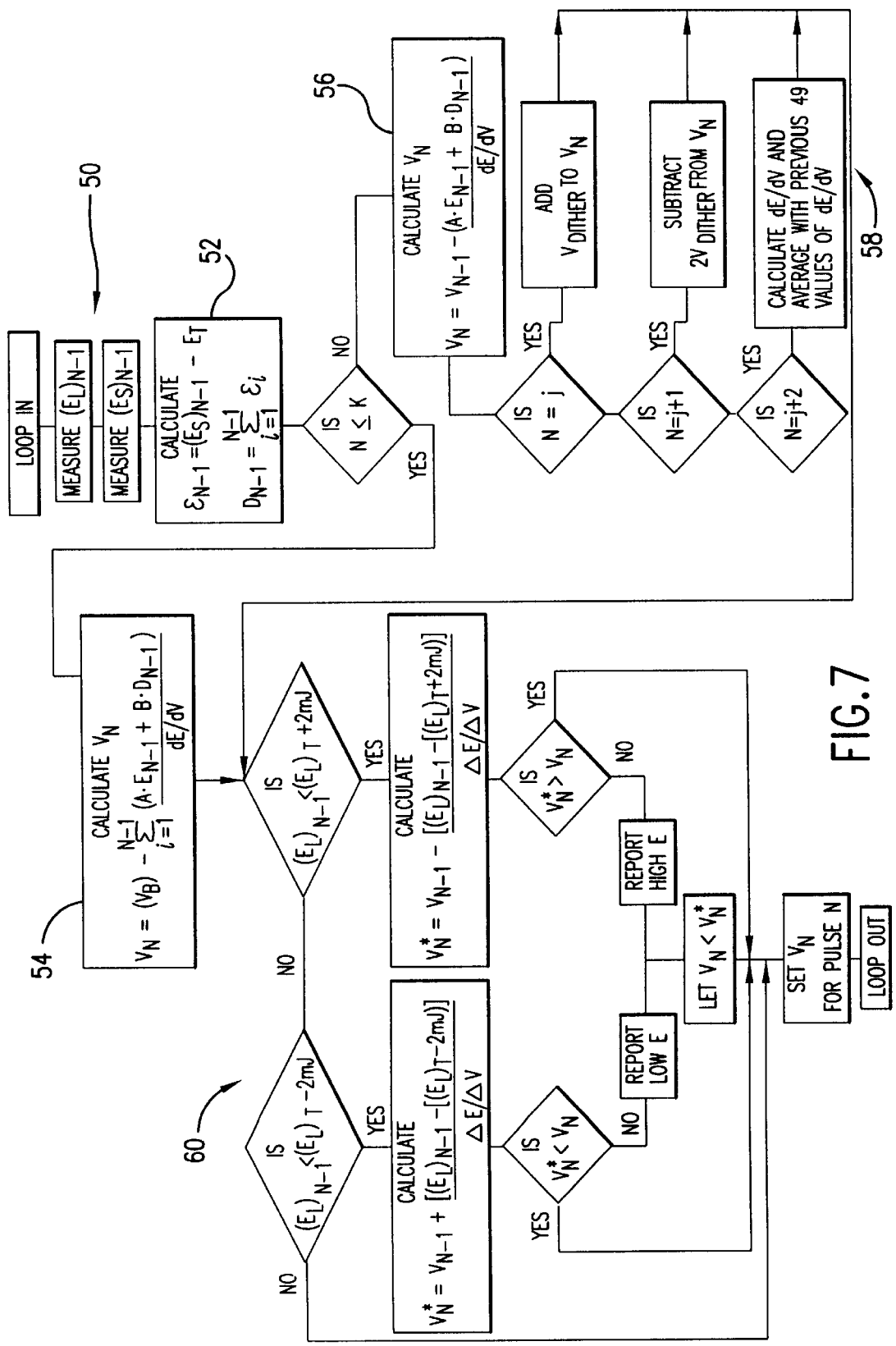
FIG. 7 is a second flowchart providing a specific algorithm for controlling the laser using two detectors, one within a stepper and the other at the output of the laser.

FIG. 7 is a flowchart showing the principal steps in a preferred pulse energy control algorithm for controlling a stepper using photodetectors both in the stepper and the laser. To set the charging voltage for pulse N, the pulse energy at the stepper, $E_S$, and at the laser $E_L$ are measured as indicated at 50. The energy error $\epsilon$ for the N−1 pulse and the dose error up to the N−1 pulse are calculated, 52.

In this embodiment, Applicants have 4 sets of bin values for each of the first 40 pulses which set of bin values is chosen based on the time interval between bursts, and the bin values are unique to each laser and vary over life. The bin values are continually updated by the energy control algorithm as the laser runs.

If N is K or less, in this case 40 pulses, the dose error and the energy errors are used along with bin values of charging voltage are used with an average value of dE/dV to calculate $V_N$ as shown at 54. If N is greater than K, the previous voltage value is used instead of the bin values as shown at 56. The measurement of dE/dV is shown at 58. In this preferred embodiment, the control unit checks the pulse energy as measured at the laser, and if the previous pulse deviates from the target energy by more than ±2 mJ, the voltage set for the next pulse will be chosen to assure that the deviation does not exceed ±2 mJ again as shown at 60. A low E or high E will also be reported to the stepper software.

Scanner Energy Control Algorithm

Figure 8:
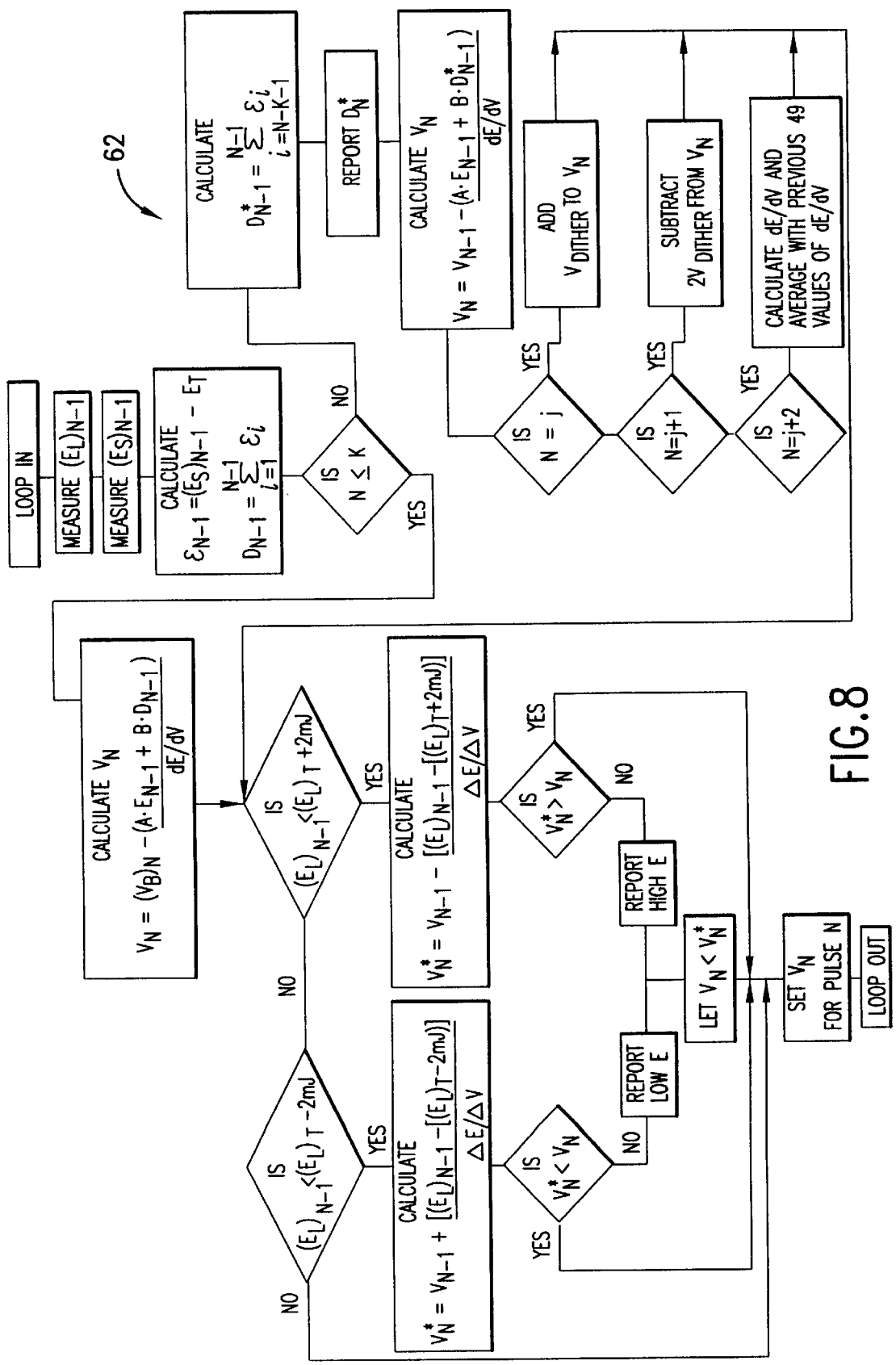
FIG. 8 is a flowchart similar to FIG. 7 except the control algorithm is preferred for a scanner.

FIG. 8 shows a similar plan for controlling the pulse energy of a scanner. It is substantially the same as the one shown in FIG. 7 for the stepper. The differences are (as shown at 62) that after K pulses (K=40 in a preferred embodiment), the dose calculation $D^*_{N-1}$ is made using only the 40 most recent pulses. This is based on a scanning plan under which the scan rate is such that each point on the wafer receives 40 pulses.

Variations

Many variations on the algorithm described above are possible. For example, the pulse energy detector located at the output of the laser could be used in the algorithm shown in FIGS. 7 and 8 and used for the calculation shown at 60, perhaps with a more narrow range. Many other modifications to the algorithm within the general principals taught by this disclosure will be obvious to persons skilled in this art. With regard to the algorithm, dE/dV can be determined in the L region as well as the K. The dithering can be performed once per burst, or several times. The dithering sequence may be performed at a fixed pulse number j as described above, or it may be initiated for a randomly chosen pulse number which varies from one burst to the next.

The reader should recognize that A, B and C are convergence factors, which could have many other values. Higher values than those specified above could provide quicker convergence but could lead to increased instability. In another preferred embodiment, $A=\sqrt{2B}$. This relationship is developed from a recognized technique to produce critical damping. B could be zero in which case there would be no dose correction; however, A should not be zero because it provides a dampening term for the dose conveyance portions of the algorithm.

If the determined value of dE/dV becomes too small the above algorithm could cause over correction. Therefore a preferred technique is to arbitrarily double dE/dV if the energy sigma value exceeds a threshold. Default values of V and dE/dV are provided for the first pulse of a burst. D is set to zero at the start of each burst. The default dE/dV is set at about three times the expected dE/dV to avoid initial over correction.

An alternate method of determining dE/dV without the dither referred to above is to merely measure and store the energy and voltage values during laser operation. (Measured rather than specified voltage values can also be used.) These data can be used to determine dE/dV as a function of V for constant pulse energy. The reader should note that each individual value of dE/dV would contain fairly large uncertainties because the elements of the value are differences of measurements having significant uncertainties. However, averaging large numbers of dE/dV values can reduce these uncertainties.

The dither exercise to determine dE/dV does not have to be made on each burst but instead could be done periodically such as once every M bursts. Or the measurement of dE/dV could be replaced by a calculation performed by the computer or the value of dE/dV could be inserted manually by the operator of the previous pulse for the calculation of $V_{N+1}$. An alternate approach would be to use the actual measured value for $V_N$ for this control system. Also the value of $V_{BIN}$ are calculated from specified values, not actual measure values in the above-described is normally a constant value such as 10 mJ but it does not have to be constant. For example, $E_T$ of the last ten pulses could be smaller than the nominal pulse energy so that percentage deviations from target $E_T$ for these pulses would have a smaller effect on the integrated pulse dose. Also, it may be preferable in some situations to program computer controller 22 to provide $E_T$ values that vary from burst to burst.

The dose control of calculation could be made on the basis of $E_L$ instead of $E_S$, or the limitation based on $E_L$ could be eliminated, or the range could be made smaller or longer. As indicated above, the computer controller is preferably programmed to automatically update bin values V based on actual collected data as the laser is run. Knowing dE/dV, $V_N$ and $E_N$, it is an easy matter for the computer to determine the voltage that would have produced ET for the particular pulse N. The early-in-the-burst transients are affected by the time interval between bursts. Therefore, it is preferred that at least three sets of bin values be established and used based on this time interval. For example, a separate set of bin values could be established for each of the following between-bursts time intervals: (1) 0 to 1.0 second, (2) 1.0 second to 10 seconds, (3) 10 seconds to 60 seconds; and (4) in excess of 60 seconds.

The following papers are incorporated by reference to provide additional detail of a scanning system's optics and methods for dosage control: "Dosage Control for Scanning Exposure with Pulsed Energy Fluctuation and Exposed Position Jitter," by K. Suzuki et al., Jpn. J. Appl. Phys. Vol 34 (1995), pp. 6565–6572, and "Performance of a Step and Scan System for DUV Lithography," by G. deZwart et al., SPIE Symposium on Optical Microlithography, March 1997.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A semiconductor wafer fabrication system comprising:
   a laser having a pulse power system for producing laser light pulses $P_1, P_2, \ldots P_{N-1}, P_N$, said pulse power system having a high voltage charging system defining a charging voltage,
   a wafer exposing system which receives light pulses generated by said laser, said exposing system providing optical elements between said laser and a mask, wherein said optical elements cause said light pulses emitted by said laser to be attenuated prior to impinging upon said mask;
   a first light intensity detector positioned within said exposing system so as to receive at least a portion of laser light pulses exiting at least one of said optic elements and prior to said light pulses impinging upon said mask;
   a second light intensity detector positioned proximate to said laser so as to receive at least a portion of laser light pulses output from said laser,
   outputs of at least one of said first light intensity detector and said second light intensity detector, being used to control an exposure of a semiconductor wafer to laser light;
   a processor programmed with an algorithm for controlling pulse energy and integrated energy dose in a dose of pulses defining present burst pulses, $P_1, P_2 \ldots P_{N-1}, P_N$, from said laser having a pulse power system including a high voltage charging system defining a charging voltage, said algorithm comprising the steps of:
   A) measuring the energy of each pulse in said burst of pulses,
   B) determining a rate of change of pulse energy with charging voltage, dE/dV,
   C) controlling the pulse energy of each pulse $P_N$ in at least one plurality of pulses in said burst of pulses by regulating the charging voltage of the laser utilizing a computer processor programmed with an algorithm which:
      1) determines for each $P_N$ a pulse energy error, $\epsilon$ based on a measured energy of at least one previous pulse in said burst and a predetermined target pulse energy value,
      2) determines for each $P_{N+1}$ an integrated dose error, D, of all previous pulses, $P_1$ through $P_N$, in said burst,
      3) determines a charging voltage, $V_{N+1}$, for each of said pulses, $P_{N+1}$, in said first plurality of pulses using:

i) said dE/dV
ii) said E
iii) said D
iv) at least one reference voltage.

2. The system of claim 1 wherein said exposing system is a stepper.

3. The system of claim 1 wherein said exposing system is a scanner.

4. A system as in claim 3 wherein said algorithm contains a routine to calculate a dose value for each of a plurality of spaces on said wafer representing the integrated pulse energy of all pulses illuminating each of said plurality of spaces.

5. The system of claim 1 both said first detector and said second detector are used in conjunction with each other to control said exposure.

6. The system of claim 1 wherein said measured energy is energy measured by said first light intensity detector.

7. The system of claim 6 wherein said algorithm comprises the steps of using pulse energy measured with said second light intensity detector to determine if pulse energy as measured by said light detector is within a predetermined range.

8. The system of claim 1 wherein said at least one previous pulse is $P_{N-1}$ and said reference voltage is a charging voltage specified for producing said $P_{N-1}$ in the present burst.

9. The system of claim 1 wherein said present burst follows and defines a plurality of previous bursts and said at least one previous pulse is $P_N$ and said reference voltage is calculated based on charging voltage values determined for $P_{N+1}$ in each of a plurality of previous bursts.

10. The system of claim 9 wherein said rate of change of pulse energy with charging voltage is determined by taking an average of a plurality of most recent values of said rate of change.

11. The system of claim 1 wherein said present burst follows and defines a plurality of previous bursts, said at least one previous pulse is $P_N$ and said at least one plurality of pulses is two pluralities of pulses, defining a first plurality of pulses and a second plurality of pulses, a first reference voltage and a second reference voltage, wherein said first reference voltage is a charging voltage determined using data from $P_{N+1}$ of a previous burst and said second reference voltage is a charging voltage determined using data from $P_N$ of the present burst.

12. The system of claim 11 wherein said algorithm comprises at least three converging factors.

13. The system of claim 1 wherein said rate of change of pulse energy with charging voltage is determined periodically using at least two measured values of pulse energy obtained during bursts each of said at least two measured values corresponding to a different value of charging voltage.

14. The system of claim 1 wherein said rate of change of pulse energy with charging voltage is determined once during each of series of bursts.

15. The system of claim 1 wherein said rate of change of pulse energy with voltage is determined using a plurality of measured values of pulse energy and a specified value of charging voltage corresponding to each measured value of pulse energy in said plurality of measured values of pulse energy.

16. A process as in claim 15 wherein said algorithm further comprises at least three converging factors each having values between 0 and 1.

17. The system of claim 1 wherein said rate of change of pulse energy with voltage is determined using a plurality of measured values of pulse energy and a measured value of charging voltage corresponding to each measured value of pulse energy in said plurality of measured values of pulse energy.

18. The system of claim 1 wherein said algorithm comprises at least two converging factors.

19. The system for controlling pulse energy and integrated energy dose in a burst of pulses defining present burst pulses, $P_1, P_2 \ldots P_N, P_{N+1} \ldots P_F$ from said excimer laser having a pulse power system including a high voltage charging system defining a charging voltage, said algorithm comprising the steps of:

A) measuring the energy of each pulse in said burst of pulses,

B) determining a rate of change of pulse energy with charging voltage, dE/dV,

C) controlling the pulse energy of each pulse $P_N$ the first K pulses, defining $P_k$ in said burst of pulses by regulating the charging voltage of the laser utilizing a computer processor programmed with an algorithm which:

1) determines for each $P_{N+1}$ a pulse energy error, E, based on a measured energy of at least one previous pulse in said burst and a predetermined target pulse energy value, 2) determines for each $P_{N+1}$ an integrated dose error, D, of all previous pulses, $P_1$ through $P_N$, in said burst, 3) determines a charging voltage, $V_{N+1}$, for each of said pulses, $P_{N+1}$, in said first plurality of pulses using:
i) said dE/dV
ii) said E
iii) said D
iv) a reference voltage based on specified voltages for $P_{N+1}$ in a plurality of previous bursts, D) controlling the pulse energy of each pulse $P_{N+1}$ in pulses following $P_k$ in said burst of pulses by regulating the charging voltage of the laser utilizing a computer processor programmed with an algorithm which:

1) determines for each $P_{N+1}$ a pulse energy error, E, based on a measured energy of at least one previous pulse in said burst and a predetermined target pulse energy value, 2) determines for each $P_{N+1}$ an integrated dose error, D, of all previous pulses, $P_1$ through $P_N$, in said burst, 3) determines a charging voltage, $V_{N+1}$, for each of said pulses, $P_{N+1}$, in said first plurality of pulses using:
i) said dE/dV
ii) said E
iii) said D
iv) a reference voltage based on a specified voltage for pulse $P_N$.

* * * * *